(12) United States Patent
Traub

(10) Patent No.: US 8,098,096 B2
(45) Date of Patent: Jan. 17, 2012

(54) DEVICE AND METHOD FOR GENERATING AN OUTPUT SIGNAL

(75) Inventor: Johann Traub, Lauingen (DE)

(73) Assignee: Infineon Technologies AG, Neubiberg (DE)

( * ) Notice: Subject to any disclaimer, the term of this patent is extended or adjusted under 35 U.S.C. 154(b) by 154 days.

(21) Appl. No.: 12/431,520

(22) Filed: Apr. 28, 2009

(65) Prior Publication Data

US 2009/0273400 A1  Nov. 5, 2009

(30) Foreign Application Priority Data

Apr. 30, 2008 (DE) .......... 10 2008 021 660

(51) Int. Cl.
*H03F 3/45* (2006.01)
(52) U.S. Cl. ...................... 330/253; 330/254
(58) Field of Classification Search .......... 330/253, 330/254; 327/355, 563
See application file for complete search history.

(56) References Cited

U.S. PATENT DOCUMENTS

| 5,077,541 | A | 12/1991 | Gilbert |
| 5,684,431 | A | 11/1997 | Gilbert et al. |
| 6,538,507 | B2 * | 3/2003 | Prentice et al. ........... 330/254 |
| 6,552,612 | B1 * | 4/2003 | Wilson .................... 330/254 |
| 2008/0048781 | A1 | 2/2008 | Wagner et al. |
| 2008/0068082 | A1 | 3/2008 | Otaka et al. |

* cited by examiner

*Primary Examiner* — Khanh Nguyen
(74) *Attorney, Agent, or Firm* — Eschweiler & Associates, LLC

(57) ABSTRACT

An embodiment provides a device for generating an output signal as a function of an input signal, wherein a plurality of circuit sections generate partial signals and the output signal is composed from the partial signals.

22 Claims, 9 Drawing Sheets

US 8,098,096 B2

DEVICE AND METHOD FOR GENERATING AN OUTPUT SIGNAL

RELATED APPLICATION

This application claims the benefit of the priority date of German application DE 10 2008 021 660.7, filed on Apr. 30, 2008, the contents of which are herein incorporated by reference in their entirety.

FIELD OF THE INVENTION

The present invention relates to devices and methods for generating an output signal as a function of an input signal, and to amplifier and multiplication arrangements including such a device.

BACKGROUND

Devices which generate an output signal as a function of an input signal in a defined manner can be used for example for driving further devices. By way of example, the output signal can depend on the input signal in accordance with a predetermined characteristic curve and be used to set the gain of an amplifier. Consequently, in such a case, by correspondingly defining the characteristic curve, it is possible to achieve a sought dependence of the gain on the input signal.

Therefore, there is a general need for such devices for generating an output signal as a function of an input signal and corresponding methods.

SUMMARY

A device for generating an output signal as a function of an input signal according to an embodiment comprises an input, at least two circuit sections, wherein each circuit section is configured for generating a partial output signal, wherein the at least two circuit sections are coupled to the input in such a way that each of the at least two circuit sections has applied to it an input signal applied to the input plus an offset assigned to each circuit section, wherein at least two of the circuit sections are assigned a different offset, and a further circuit section for combining the output partial signals to form an output signal.

The offset assigned to a circuit section of the at least two circuit sections can in this case be positive, negative or also zero.

Other embodiments of the invention can have less, further and/or additional features and properties.

DETAILED DESCRIPTION

Figure 1:
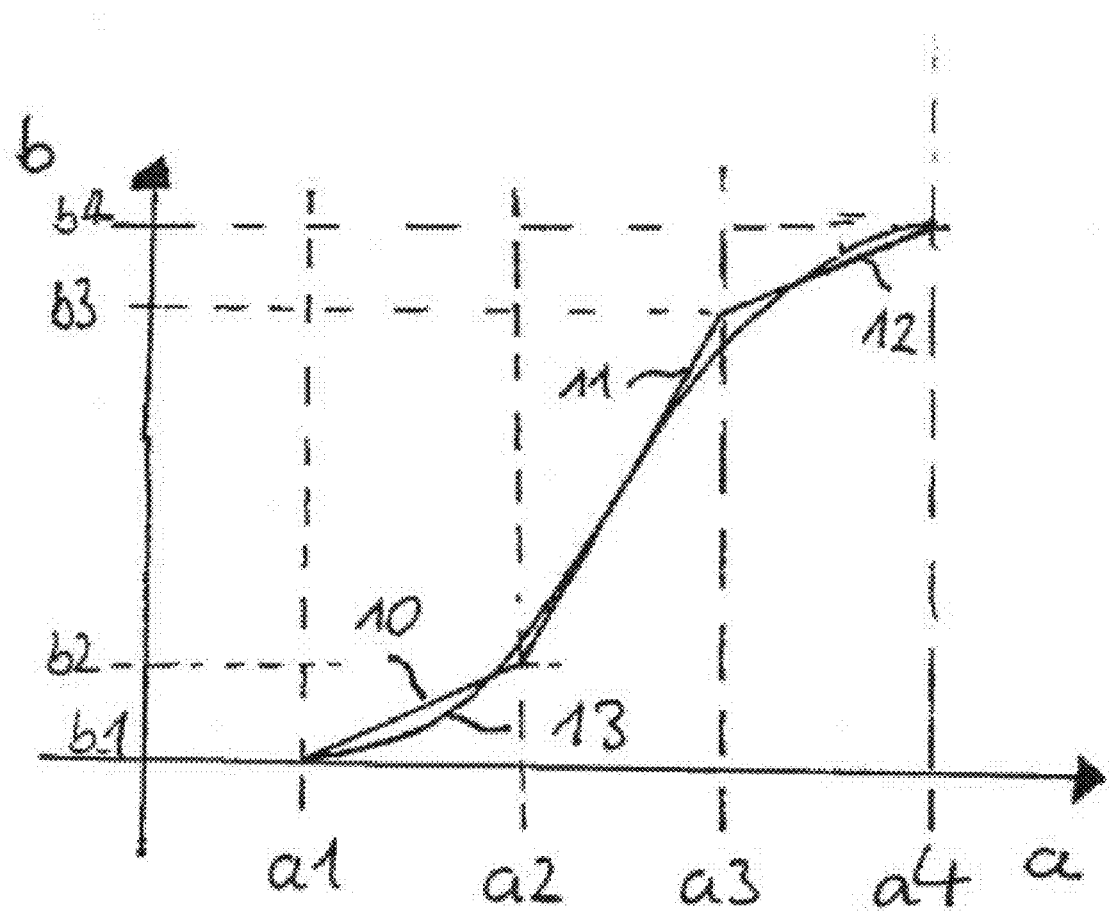
FIG. 1 shows a diagram of a ramped characteristic curve approximated in sections for illustrating an embodiment of the present invention.

In the following, embodiments of the present invention will be described in detail with reference to the attached drawings. It is to be noted that the embodiments described hereinafter are merely intended to illustrate the present invention and are not to be construed as limiting the scope thereof. It is to be understood that in the following description of embodiments, any direct connection or coupling between functional blocks, device, components, circuit elements or other physical or functional units shown in the drawings or described herein, i.e. any connection without intervening elements, could also be implemented by an indirect connection or coupling, i.e. a connection or coupling with one or more additional intervening elements. Furthermore, it should be appreciated that the partitioning of embodiments into functional blocks or units shown in the drawings is not to be construed as indicating that these units necessarily are implemented physically separate. Generally, functional blocks or units may be implemented as separate circuits, chips or elements, but two or more functional blocks or units may also be implemented in a common circuit-or common chip.

It is to be understood that features of various embodiments described hereinafter may be combined with each other unless specifically noted otherwise.

Furthermore, it is to be understood that describing an embodiment comprising a plurality of elements is not to be construed as indicating that all these elements are necessary for practicing the present invention. Instead, in other embodiments, only some of such elements and/or alternative elements may be present.

It is to be noted that any directional terminology like "top", "bottom", "left" or "right" used in the following detailed description is merely used for easy reference to certain portions of the drawings and is not to be construed as limiting the actual positioning of elements of embodiments in implementations thereof.

In the figures, like reference numerals indicate similar or equivalent, but not necessarily identical elements.

Firstly, embodiments of devices for generating an output signal or a plurality of output signals as a function of an input signal will be discussed in the following description.

The embodiments firstly discussed below in this case have a ramped characteristic curve, that is to say that with a rising value of the input signal the output signal rises or falls from a first value to a second value.

Such a ramped characteristic curve is illustrated by way of example in FIG. 1 and identified by the reference symbol 13. In this case, by way of example, an input signal a is represented on the abscissa and an associated output signal b is represented on the ordinate. If the input signal a rises from a value a1 to a value a4, then the output signal b rises from a value b1 to a value b4 in a manner corresponding to the ramped characteristic curve 13. In this case, the form of the ramped characteristic curve from FIG. 1 should be understood as by way of example, and other embodiments can have other ramped characteristic curves.

In one embodiment, the output signal b is composed by superposition from two or more partial output signals, wherein each partial output signal essentially determines a section of the ramped characteristic curve. For example, the characteristic curve 13 from FIG. 1 can be subdivided into three sections, wherein a first section ranges from values of the input signal a1 to a2, a second section for values a2 to a3 and a third section for values from a3 to a4. In each of these sections, the characteristic curve 13 has an average gradient, as illustrated by segments 10, 11 and 12 in FIG. 1. In the example illustrated in FIG. 1, the segments 10 and 12 have approximately the same gradient, while the segment 11 has a larger gradient. In other examples, all the sections can have different average gradients, and/or only two or more than three sections can be provided.

In one embodiment, in a manner corresponding to the characteristic curve from FIG. 1, the output signal b can then be composed from a first partial output signal, which, from a1 to a2, rises from a value b1 to a value b2 and then remains constant, a second partial output signal, which, from a2 to a3, rises from the value 0 to a value b3 to b2 and then remains constant, and a third output signal, which, from a3 to a4, rises from a value 0 up to a value b4 to b3. In one embodiment, the input signal a can be a voltage signal and the output signal b can be a current signal. In other embodiments, it is also possible for the output signal b to be a voltage signal and/or the input signal a to be a current signal.

In one embodiment, the output partial signals are generated by different circuit sections of a corresponding device.

Figure 2:
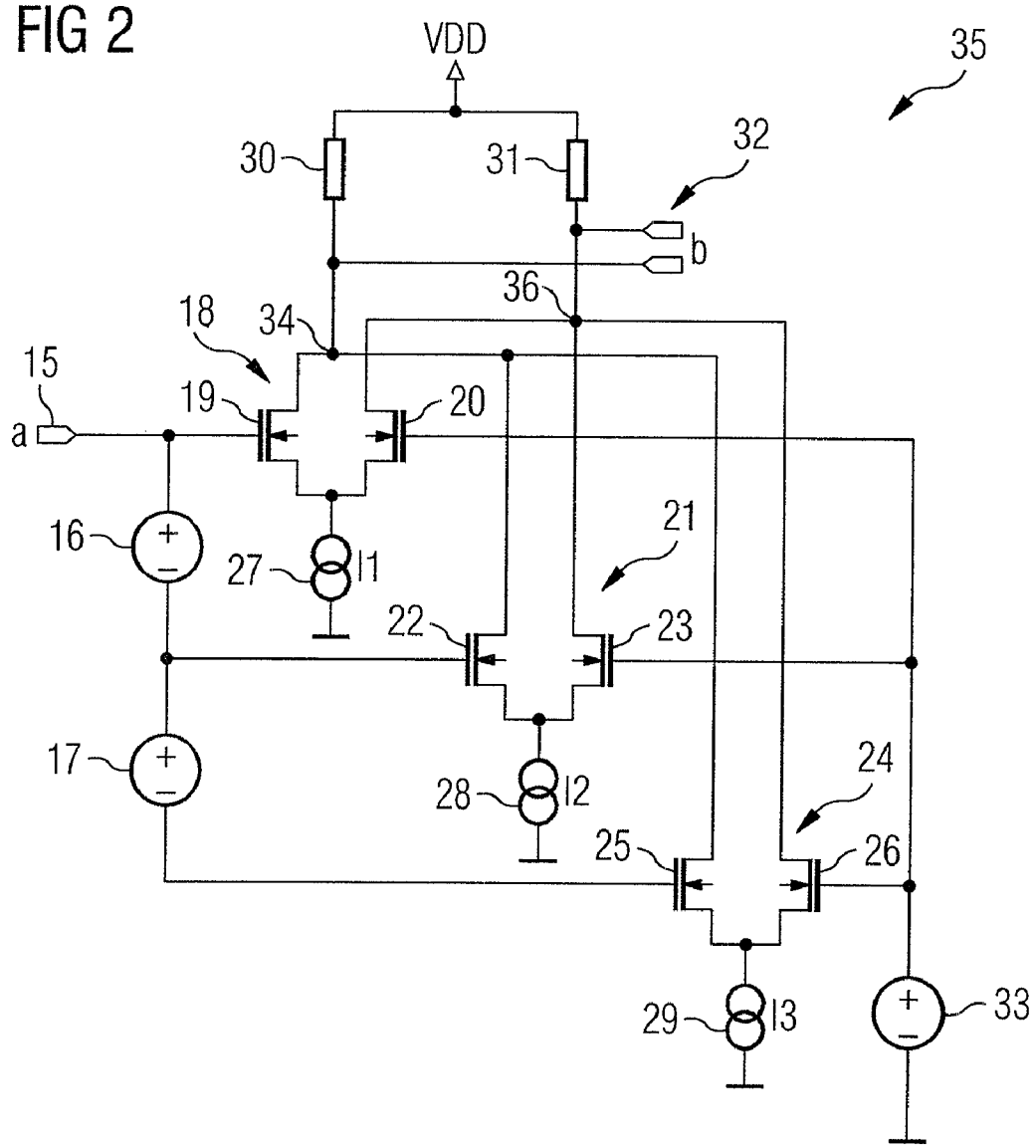
FIG. 2 shows a circuit diagram of a device in accordance with an embodiment of the present invention.

A circuit diagram of such a device 35 in accordance with one embodiment of the invention is illustrated in FIG. 2.

In the embodiment in FIG. 2, the output signal b at an output 32 is generated as a function of the input signal a present at an input 15. In the embodiment in FIG. 2, the input signal a and the output signal b are voltage signals.

The device 35 in FIG. 2 comprises three circuit sections for generating partial output signals, wherein a first circuit section comprises a first differential amplifier 18 having NMOS transistors 19, 20 and a current source 27, a second circuit section comprises a second differential amplifier 21 having NMOS transistors 22 and 23 and a second current source 28, and a third circuit section comprises a third differential amplifier 24 having NMOS transistors 25 and 26 and a third current source 29. The device in FIG. 2, in particular the NMOS transistors 19, 20, 22, 23, 25 and 26, can be fabricated using CMOS technology. In one embodiment, the NMOS transistors 19, 20, 22, 23, 25 and 26 are dimensioned identically, wherein different dimensionings are also possible in another embodiment.

In the embodiment in FIG. 2, a voltage defined by a voltage source 33 is applied to gate terminals of the NMOS transistors 20, 23 and 26. In this case, the voltage source 33 can be a resistor through which a constant current flows.

A gate terminal of the NMOS transistor 19 is coupled to the input 15 and thus has the input signal a applied to it. A gate terminal of the NMOS transistor 22 is coupled to the input 15 via a voltage source 16 and thus has applied to it the input signal a plus an offset voltage determined by the voltage source 16. A gate terminal of the NMOS transistor 25 is coupled to the input 15 via the voltage source 16 and a voltage source 17 and thus has applied to it the input signal a plus an offset determined by the voltages of the voltage sources 16 and 17. Consequently, inputs of the differential amplifiers 18, 21 and 24 have applied to them the signal a plus an offset voltage assigned to the respective differential amplifier, wherein the offset voltage in the embodiment in FIG. 2 for the differential amplifier 18 is essentially equal to zero. It should be noted that through the use of voltage sources 16 and 17 in the embodiment of FIG. 2 the respective offset voltages are independent from a value of the input signal a.

In the embodiment in FIG. 2, the response of the differential amplifiers 18, 21 and 24 with respect to the input signal a is offset by the offset voltages. In this way, the values a2 and a3 can be defined for example for generating a ramp form as illustrated by way of example in FIG. 1. For example, the value a2 can be defined relative to the value a1 by means of the voltage source 16 and the value a3 can be defined relative to the value a2 by means of the voltage source 17.

Currents I1, I2 and I3 generated by the current sources 27, 28 and 29, respectively, are a parameter that determines the gain of the differential amplifiers 18, 21 and 24, respectively. By choosing the currents I1, I2 and I3, it is possible for example to define the slope of the partial output signals output by the respective circuit section as a function of the input signal. In order to obtain a ramped characteristic curve as illustrated in FIG. 1, for example, in which the gradient of the segment 10 is approximately equal to the gradient of the segment 12, while the gradient of the segment 11 is or example twice as high, it is possible to choose I1=I3 and I2=2·I1. A different curve shape with different gradients can be generated by a different choice of the currents.

The currents flowing from the transistors 19, 22 and 25 as a function of the input signal a are added at a node 34, while the currents flowing through the transistors 20, 23 and 26 as a function of the output signal a are added at a node 36. Via resistors 30, 31 connected between the nodes 34 and 36, respectively, and a positive supply voltage VDD, the partial output signals thus combined are converted into two voltage signals, which can be tapped off as output signal b at the output 32.

In a manner corresponding to the subdivision into three sections in FIG. 1, three circuit sections for generating the partial output signals are provided in the embodiment in FIG. 2. However, this number of circuit sections should be understood merely by way of example, and a different number of circuit sections, for example two circuit sections or more than three circuit sections, can be provided in other embodiments. The number of voltage sources 16, 17 can also be varied accordingly.

In some applications, it may be desirable to generate more than one output signal, wherein each output signal is dependent on the input signal in a manner corresponding to a respective characteristic curve. Three mutually offset ramped characteristic curves 36, 37, 38 are illustrated as an example in FIG. 3. In the example in FIG. 3, the characteristic curves 36, 37, 38 "overlap", that is to say that for example the characteristic curve 37 begins to rise from b1 to b4 before the characteristic curve 36 has attained the value b4 as a function of the input signal a. In other applications, it may be desirable to provide non-overlapping characteristic curves for a plurality of output signals. It should be noted that the illustration of three characteristic curves 36, 37 and 38 should once again be understood as an example, and more or fewer characteristic curves than those illustrated can be used. Moreover, in the example in FIG. 3, the characteristic curves 36, 37 and 38 have approximately the same curve shape. In other embodiments, a plurality of characteristic curves having different curve shapes, e.g. different gradients and/or different start and end values b1, b4, can be provided.

Figure 3:
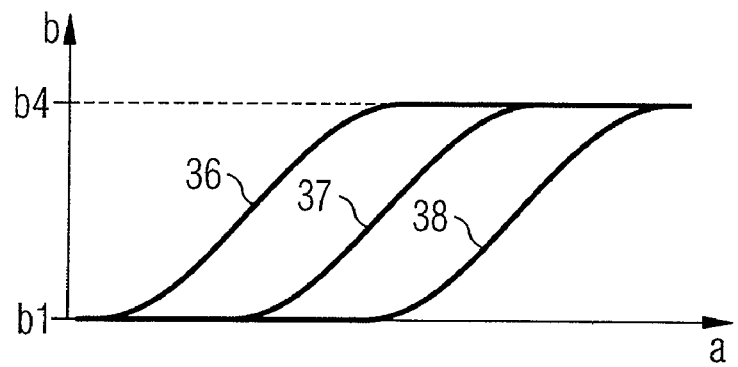
FIG. 3 shows a diagram showing three ramped characteristic curves for illustrating an embodiment of the present invention.
Figure 4:
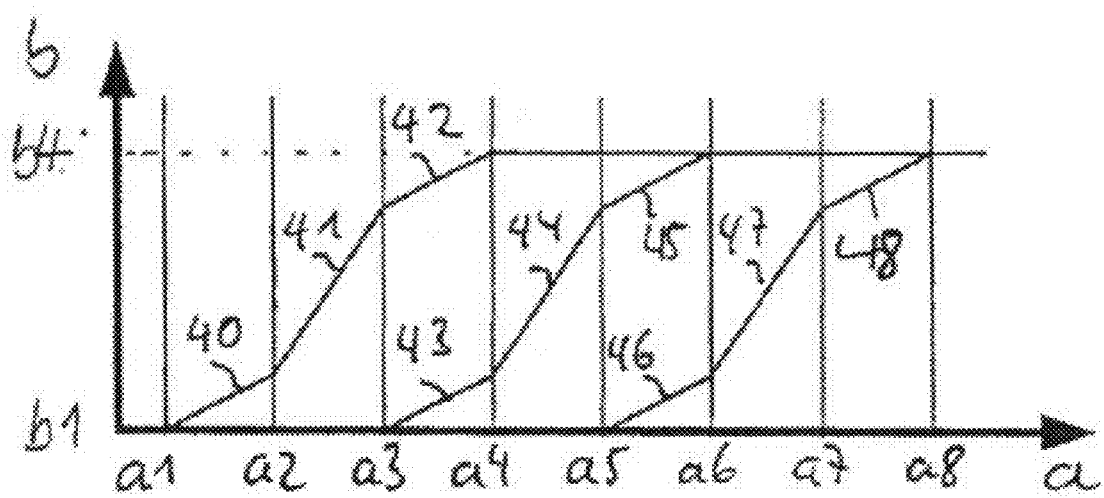
FIG. 4 shows a diagram showing the ramps from FIG. 3 approximated in sections.

In one embodiment of the invention, the individual characteristic curves 36, 37 and 38 are subdivided into partial sections, and the respective output signal is composed from partial output signals, wherein each partial output signal determines the partial section of the respective characteristic curve. This subdivision, which is similar to the subdivision from FIG. 1, is schematically illustrated in an exemplary manner in FIG. 4. In the subdivision in FIG. 4, the first characteristic curve 36 from FIG. 3 is subdivided into three sections 40, 41 and 42, the second characteristic curve 37 from FIG. 3 is subdivided into three sections 43, 44 and 45, and the third characteristic curve 38 from FIG. 3 is subdivided into three sections 46, 47 and 48. Each of the partial sections is illustrated in FIG. 4 as a segment having a gradient which can correspond for example to the average gradient of the corresponding characteristic curve in this section. It should be noted in this respect that this does not imply that the individual partial signals are in each case linear signals and the form of the resulting characteristic curve is actually composed from segments; rather, the illustration in FIG. 4 serves for clarification purposes.

In FIG. 4, signal values a1 to a8 of the input signal a identify the limits between the sections. A third section of a characteristic curve in each case overlaps a first section of a following characteristic curve. In another embodiment, the limits of the last section of a characteristic curve do not have to be identical with the limits of the first section of the following characteristic curve; rather, essentially any desired limits and overlap ranges can be chosen.

A device 100 in accordance with one embodiment of the invention for generating three output signals in accordance with three mutually offset ramped characteristic curves, for example those discussed with reference to FIGS. 3 and 4, is illustrated schematically in FIG. 5. In the device 100, an output signal c that can be tapped off at an output 70, an output signal d that can be tapped off at an output 80 and an output signal e that can be tapped off at an output 90 are generated as a function of an input signal a applied to an input 101. In this case, a circuit part 50 generates the output signal c, a circuit part 51 generates the output signal d and a circuit part 52 generates the output signal e. In the embodiment in FIG. 5, the circuit parts 50, 51 and 52 are constructed in a manner corresponding to one another and in each case essentially correspond to the device 35 in the embodiment in FIG. 2.

By way of example, each of the circuit parts 50, 51 and 52 has three circuit sections each having a differential amplifier and a current source. In this case, the circuit section 50 has a first circuit section having a first differential amplifier 61 and a first current source 62, a second circuit section having a second differential amplifier 63 and a second current source 64, and a third circuit section having a third differential amplifier 65 and a third current source 66, wherein each differential amplifier 61, 63 and 65 has two NMOS transistors. The gate inputs of those NMOS transistors of the differential amplifiers 61, 63 and 65 which are illustrated respectively on the right of FIG. 5 have a fixed voltage applied to them by means of a voltage source 60. In the embodiment in FIG. 5, output currents of these NMOS transistors respectively on the right are conducted away to VDD via a node 67, while output currents of those NMOS transistors of the differential amplifiers 61, 63 and 65 which are illustrated respectively on the left are summed at nodes 68 and 69 and can be tapped off as output current signal c at the output.

Figure 5:
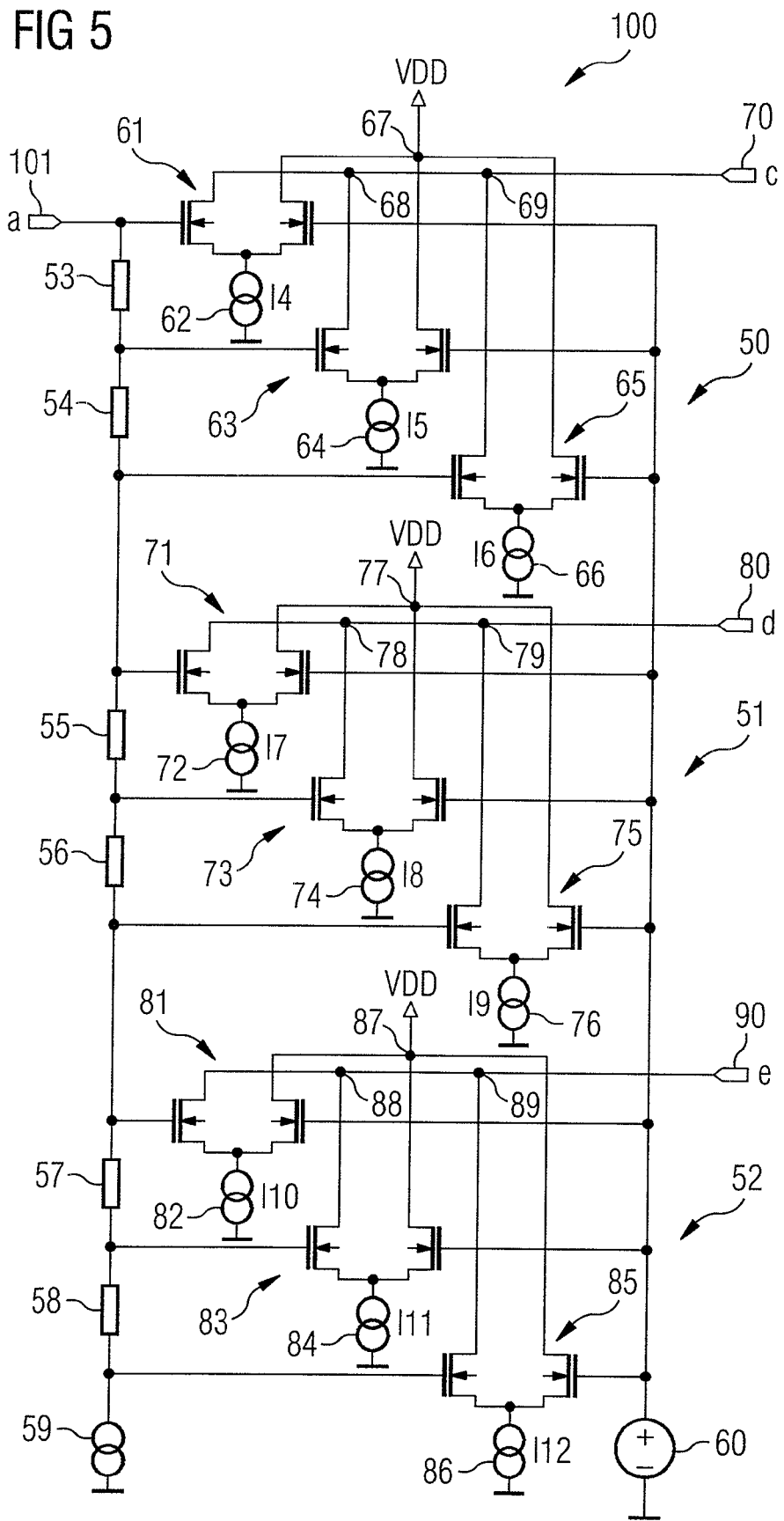
FIG. 5 shows a circuit diagram of a device in accordance with one embodiment of the present invention.

The circuit part 51 and the circuit part 52 are developed in each case in a manner corresponding to the circuit part 50, wherein in FIG. 5 the reference symbols of the elements just explained for the circuit part 50 are increased by 10 for the circuit part 51 and by 20 for the circuit part 52. By way of example, the first differential amplifier bears the reference symbol 71 in the circuit part 51 and the reference symbol 81 in the circuit part 52.

Those NMOS transistors of the differential amplifiers 61, 63, 65, 71, 73, 75, 81, 83 and 85 which are illustrated respectively on the left in FIG. 5 have applied to them the input signal a plus an offset assigned to the respective differential amplifier. In this case, in the embodiment of FIG. 5, the respective offset is determined by a series circuit comprising resistors 53 to 58 around which flows a constant current generated by a current source 59. The resistors 53 to 58 together with the current source 59 correspond to the voltage sources 16 and 17 of the device 35 in FIG. 2 and represent one possible example of the realization thereof. In the embodiment of FIG. 5, the offset assigned to the differential amplifier 61 is in this case essentially equal to zero.

As already mentioned, the circuit parts 50, 51 and 52 essentially correspond to the device 35 from FIG. 2, and so the modes of functioning thereof will not be explained in detail again. In the embodiment in FIG. 5, the characteristic curve of each circuit part 50, 51 and 52 is a ramp composed from three sections, wherein the slope of the individual sections is determined by the currents I4, I5, I6; I7, I8, I9 and I10, I11, I12, respectively. In this case, the respective offset determined by the resistors 53 to 58 determines firstly the offset between the sections of the characteristic curves and secondly the offset of the characteristic curves among one another. In relation to the example in FIG. 5, the resistors 53 to 58 determine the position of the values a2 to a8 relative to the value a1. In one embodiment, the resistors 53 to 5& have the same resistance, which corresponds to an equidistant arrangement of the signal values a1 to a8 from FIG. 4. In another embodiment, different resistances can be used for the resistors 53 to 58.

In the device 100 of the embodiment in FIG. 5, the offset assigned to the differential amplifier 65 corresponds to the offset assigned to the differential amplifier 71, and the offset assigned to the differential amplifier 75 corresponds to the offset assigned to the differential amplifier 81. This corresponds to the overlapping of the characteristic curves as illustrated by way of example in FIG. 4. In another embodiment, a different offset can be assigned to the differential amplifiers 65 and 71 and/or to the differential amplifiers 75 and 81—for example by means of an additional resistor in each case—which correspondingly alters the overlapping between the characteristic curves of the individual circuit parts 50, 51 and 52.

In one embodiment, the device 100 is implemented using CMOS technology. Other implementing techniques can be used in other embodiments.

While the differential amplifiers are constructed with NMOS transistors in the device 35 and the device 10C in accordance with the embodiments illustrated, other types of transistors, for example PMOS transistors or other types of field effect transistors, can be provided in another embodiment. Moreover, other types of amplifiers, for example operational amplifiers, can be provided instead of the differential amplifiers.

In the device 100 of the embodiment in FIG. 5, the circuit parts 50, 51 and 52 are constructed in a manner corresponding to one another and comprise for example three circuit sections in each case. In another embodiment, different circuit parts can have a different number of circuit sections, with the result that the corresponding characteristic curves of the circuit parts are subdivided into a different number of sections. It should also be noted that more or fewer than three circuit parts for generating output signals can be provided depending on the desired number of output signals.

The possible alterations and modifications in accordance with embodiments of the invention as discussed with regard to the device 35 in FIG. 2 can also be applied to the circuit parts 50, 51 and 52 of the device in FIG. 5, in which case the same modifications need not necessarily be applied in all the circuit parts.

In the device 100 of the embodiment in FIG. 5, the differential amplifiers of the circuit parts 50, 51 and 52 are driven asymmetrically with a unipolar input signal a, and unipolar output signals c, d and e are generated. In another embodiment, the differential amplifiers can be driven symmetrically, and/or differential output signals can be generated. A circuit diagram of a device 200 corresponding to such an embodiment is illustrated in FIG. 6.

Figure 6:
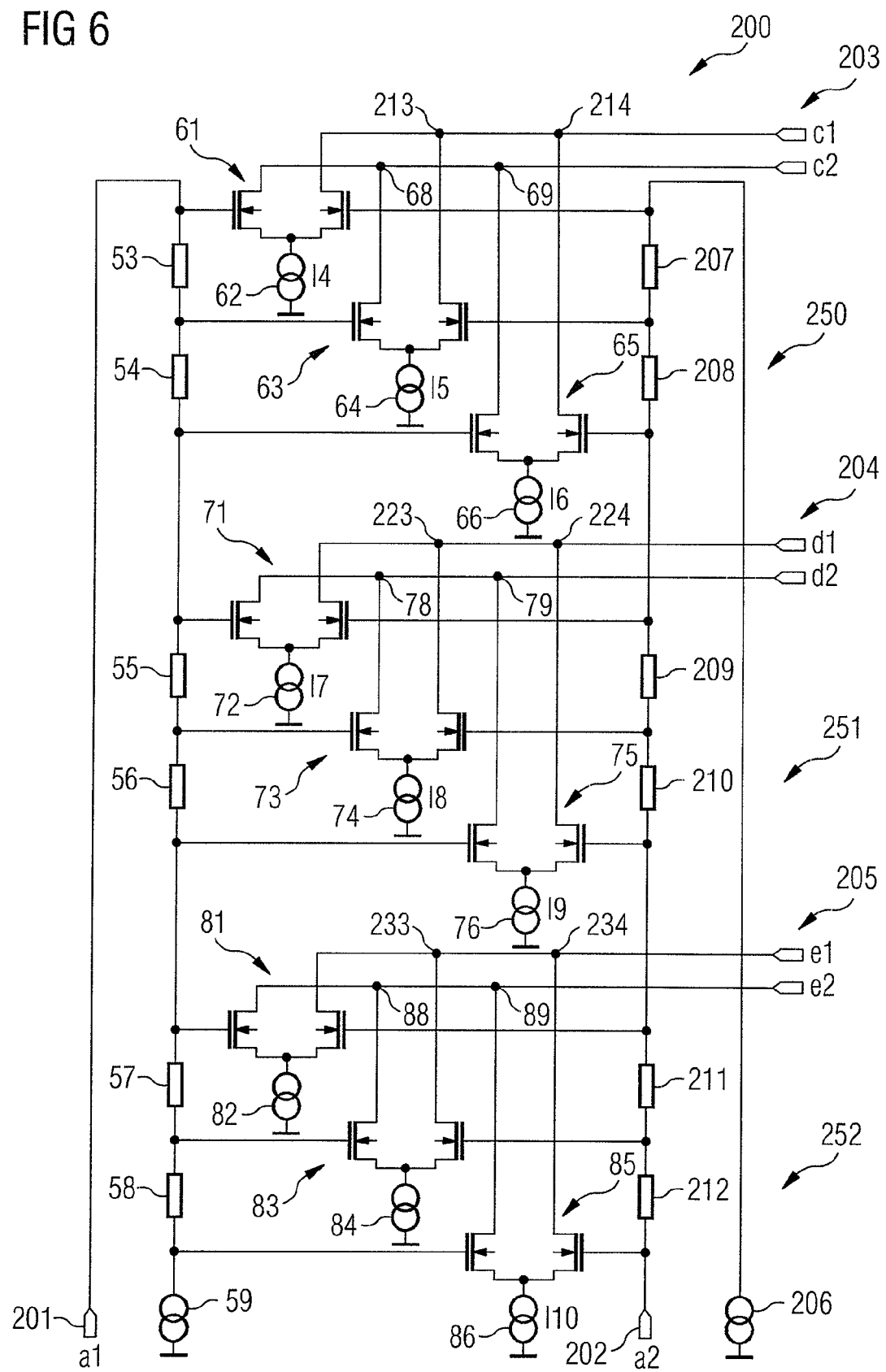
FIG. 6 shows a circuit diagram of a device in accordance with a further embodiment of the present invention.

The device 200 from FIG. 6 is a modification of the device 100 from FIG. 5, and mutually corresponding elements bear the same reference symbols. In particular, circuit parts 250, 251, 252 in FIG. 6 and the rest of the construction of the device 200 in FIG. 6 correspond to the corresponding circuit parts 50, 51 and 52 from FIG. 5, apart from the differences explained below.

In the device 200 from FIG. 6, two inputs 201, 202 are provided, to which two partial signals a1, a2 of a differential control signal can be applied during operation of the circuit. The partial signal a2 can correspond for example to the partial signal a1 in inverted form.

While in the device 100 from FIG. 5 the gate inputs of those NMOS transistors of the differential amplifiers which are illustrated respectively on the right have a constant voltage applied to them by means of the voltage source 60, in the device 200 a current source 206 and a series circuit comprising resistors 207-212 for the input 202 are provided in a similar manner to the current source 59 and the resistors 53-58 for the input 201. Consequently, the gate terminals of the transistors illustrated respectively on the right have applied to them the partial signal a2 plus a respective offset, wherein the offset is defined by the resistors 207-212 and also the current of the current source 206, and wherein the offset for the differential amplifier 85 is essentially zero. The mode of functioning of the current source 206 and of the resistors 207-212 corresponds to the mode of functioning of the current source 59 and of the resistors 53-58 that has already been explained with reference to FIG. 5.

In one embodiment, the resistances of the resistors 207-212 can be identical and/or correspond to those of the resistors 53-58. In other embodiments, different resistances can be used.

As in the device 100 from FIG. 5, the output currents of those NMOS transistors of the differential amplifiers which are respectively on the left in each circuit section are summed at nodes 68, 69; 78, 79 and 88, 89, respectively, and thus form partial output signals c2, d2 and e2, respectively, which can be tapped off at outputs 203, 204 and 205, respectively. In addition, the output currents of those NMOS transistors of the differential amplifiers which are respectively on the right are summed at nodes 213, 214 for the circuit part 250, at nodes 223, 224 for the circuit part 251 and at nodes 233, 234 for the circuit part 252, in order to form partial output signals c1, d1 and e1, respectively, which can likewise be tapped off at the outputs 203, 204 and 205 respectively. Consequently, the device 200 of the embodiment of FIG. 6 provides differential output signals (c1, c2), (d1, d2) and (e1, e2).

For the rest, the mode of functioning of the device 200 of the embodiment in FIG. 6 corresponds to the mode of functioning of the device 100 of the embodiment in FIG. 5 and is therefore not explained again. It should be noted that the variations discussed with regard to the embodiment in FIG. 5 can also be applied to the device 200 of the embodiment in FIG. 6.

In the embodiments, in FIGS. 5 and 6, three ramped characteristic curves in each case are generated by circuit parts operating using analog technology. In another embodiment, such ramped characteristic curves can be generated digitally at least in part. A device 300 in accordance with one embodiment of the invention for generating three output signals as a function of an input signal is illustrated schematically in FIG. 7.

Figure 7:
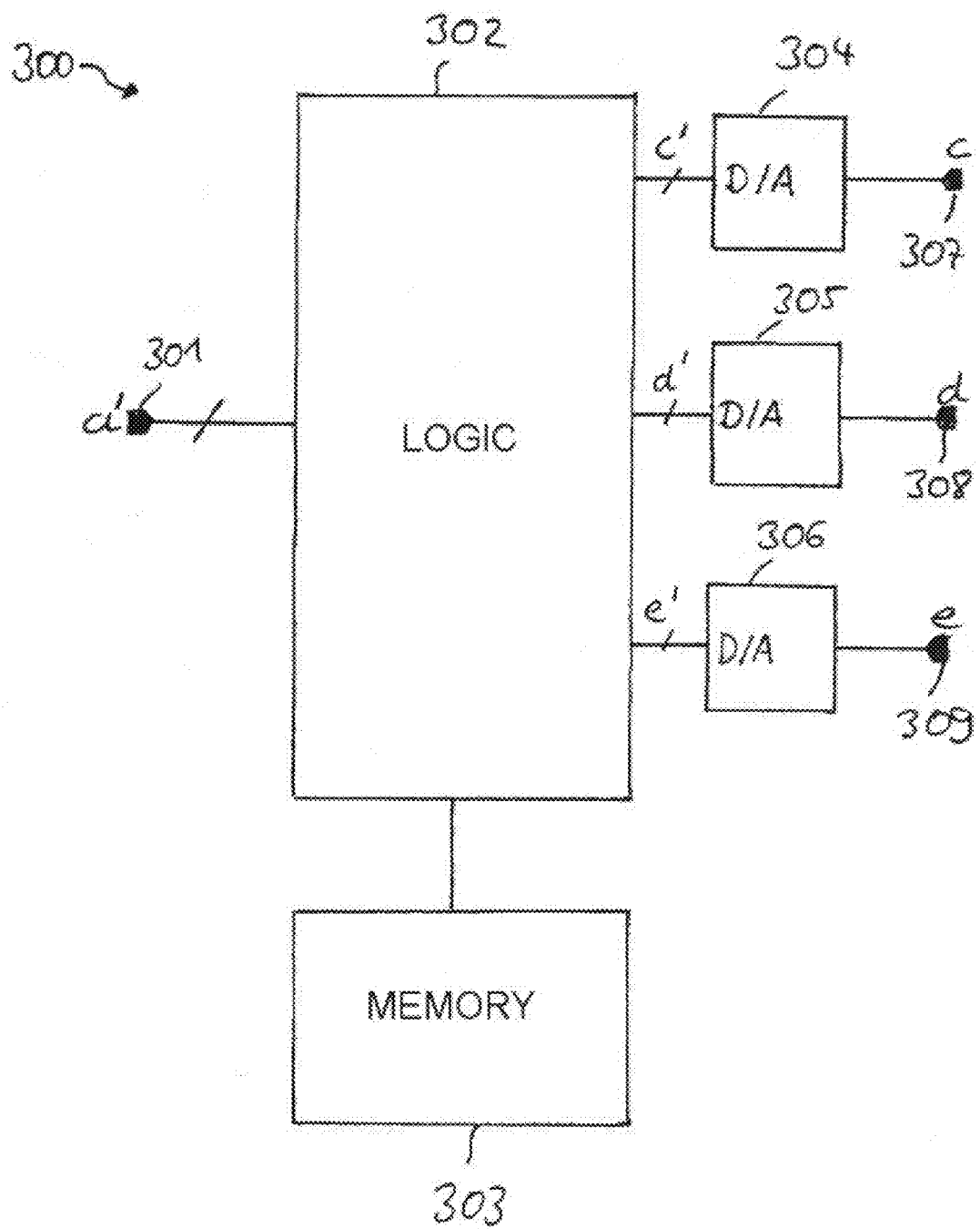
FIG. 7 shows a circuit diagram of a device in accordance with another embodiment of the present invention.

The device 300 from FIG. 7 has an input 301 for applying a digital input signal a'. The input 301 is coupled to a digital logic 302, which, as a function of the digital input signal a', generates three digital output signals c', d', e' in accordance with respective ramped characteristic curves, for example corresponding to the characteristic curves illustrated in FIG. 3. In the embodiment of FIG. 7, these characteristic curves are stored in a memory 303 accessed by the logic circuit 302. In another embodiment, the characteristic curves can also be calculated by the logic circuit 302 in accordance with predetermined parameters and corresponding digital output signals c', d', e' can be output. A bit width of the input signal a' and of the output signals c', d', e' can be chosen in each case in a manner corresponding to a desired resolution.

In the device 300 of the embodiment of FIG. 7, the digital output signals c', d' and e' are each fed to an assigned digital-to-analog converter 304, 305 and 306, respectively, and converted into analog output current signals c, d and e. In another embodiment, voltage signals can be output instead of current signals.

As in the embodiments in FIGS. 5 and 6, the number of three output signals should be understood merely as by way of example, and a corresponding device in accordance with one embodiment can be configured for outputting fewer than three or more than three output signals. Moreover, in another embodiment, a corresponding device can be configured for generating differential output signals.

A description is given below, with reference to FIGS. 8 and 9, of amplifier arrangements in accordance with embodiments of the present invention which have a device in accordance with an embodiment as discussed with reference to FIG. 5 for setting a gain. Such amplifier arrangements having an adjustable gain are also referred to as a variable gain amplifier (VGA) or variable gain control (VGC).

Figure 8:
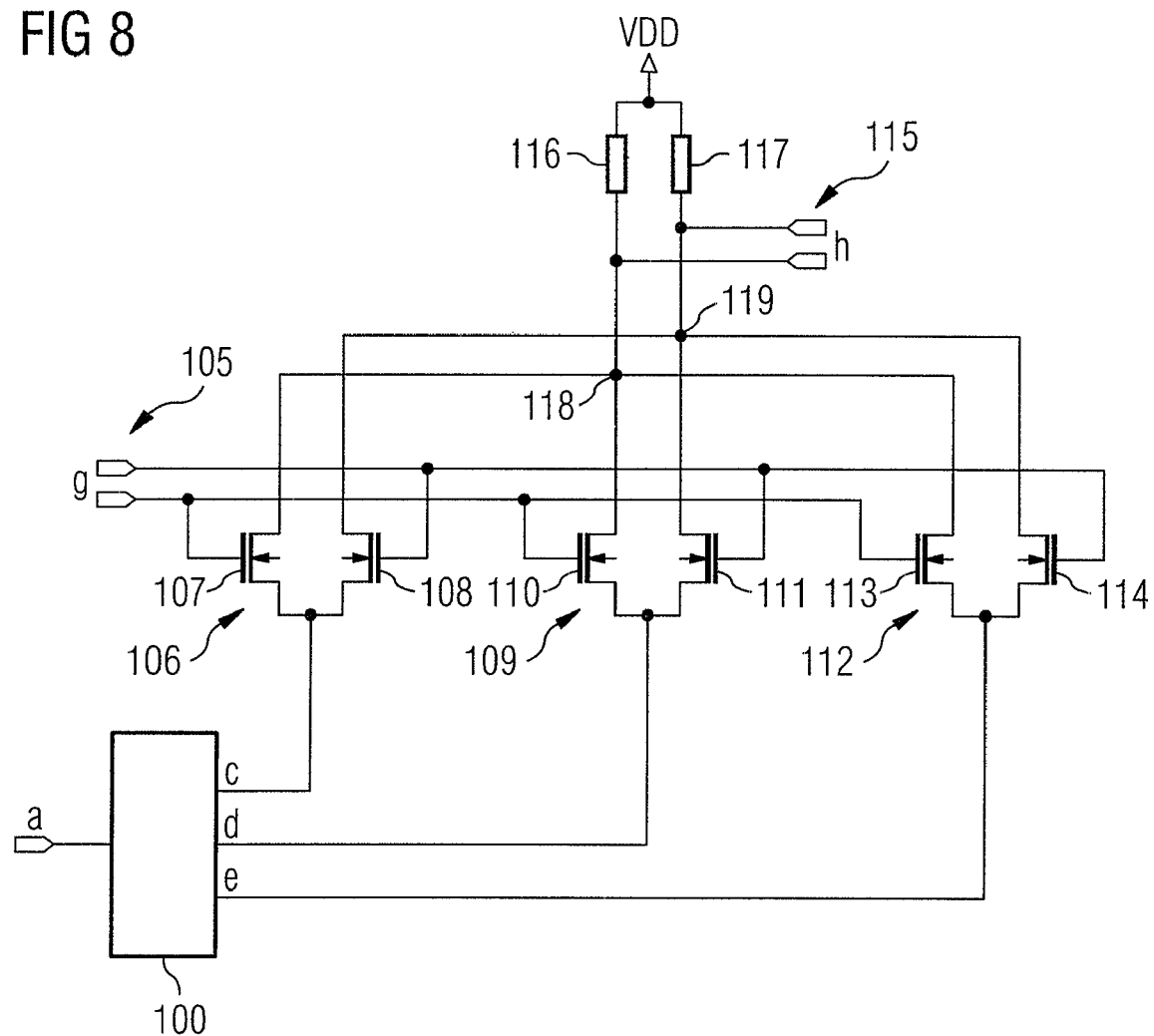
FIG. 8 shows a circuit diagram of an amplifier arrangement in accordance with one embodiment of the present invention.

FIG. 8 illustrates a first embodiment of such an amplifier arrangement. In the amplifier arrangement of the embodiment of FIG. 8, a differential input signal g is applied to a differential input 105 and a differential output signal h amplified by the amplifier arrangement is tapped off at a differential output 115. In another embodiment, unipolar signals can be used instead of differential signals.

The amplifier circuit comprises a first differential amplifier 106 having two NMOS transistors 107, 108, a second differential amplifier having two NMOS transistors 110, 111 and a third differential amplifier having two NMOS transistors 113, 114. The NMOS transistors 107, 108, 110, 111, 113 and 114 can be fabricated using CMOS technology, for example. The differential input signal is applied to each of the differential amplifiers 106, 109, 112 in parallel as illustrated in FIG. 8.

The outputs of the differential amplifiers 106, 109 and 112 are summed at nodes 118 and 119, respectively, which are connected to a positive supply voltage VDD via resistors 116 and 117, respectively. The output signal h is tapped off between the nodes 118, 119 and the resistors 116, 117, as illustrated in FIG. 8.

In one embodiment, the NMOS transistors of the differential amplifiers 106, 109 and 111 are dimensioned differently. By way of example, the NMOS transistors 110, 111 can have double the gate width compared with the NMOS transistors 107, 108, and the NMOS transistors 113, 114 can have double the gate width compared with the NMOS transistors 110, 111. In another embodiment, the dimensioning can be different as described above; by way of example, all the NMOS transistors can be dimensioned identically, or the relationships can be different as specified above.

For setting the gain, a device 100 corresponding to FIG. 5 is provided in the embodiment in FIG. 8, wherein an input signal a for the device 100 serves for setting the gain. The first output signal c serves as current supply for the first differential amplifier 106, the second output signal d serves as current supply for the second differential amplifier 109, and the third output signal e of the device 100 serves as current supply for the third differential amplifier 112. The differential amplifiers 106, 109 and 112 are driven in offset fashion in a manner corresponding to the offset ramped characteristic curves of the output signals c, d, e of the device 100 which were explained in an exemplary manner with reference to FIGS. 3 and 4.

As already explained with reference to FIGS. 2 and 5, the ramped characteristic curves of the device 100 can be set essentially in any desired manner by a corresponding choice of the currents and the offsets. Through a suitable choice of the characteristic curve, it is thus possible to achieve a desired characteristic curve for the gain control of the amplifier arrangement in FIG. 8, that is to say a desired dependence of the gain as a function of the input signal a. By way of example, it is possible to achieve a dB-linear gain characteristic curve, in which the gain in dB is linearly dependent on the input signal a. By means of the offset characteristic curves for the output signals c, d and e together with the configuration of the differential amplifiers 106, 109 and 112, it is additionally possible to achieve a high linearity of the amplifier circuit itself, that is to say a linear dependence of the output signal h on the input signal g, but also any other desired dependence.

In this case, the number of three differential amplifiers 106, 109 and 113 should be understood as by way of example, and a lower or higher number of differential amplifiers can be provided depending on the desired properties of the amplifier arrangement and the desired operating range of the amplifier arrangement. The number of circuit parts of the device 100 can then be chosen in a manner corresponding to the number of differential amplifiers. Amplifiers other than differential amplifiers can also be used.

As already mentioned, the amplifier arrangement in FIG. 8, in particular its transistors, can be fabricated using CMOS technology. In other embodiments, other fabrication technologies can also be used and transistors other than NMOS transistors, for example PMOS transistors, other types of field effect transistors and the like, can be used.

Figure 9:
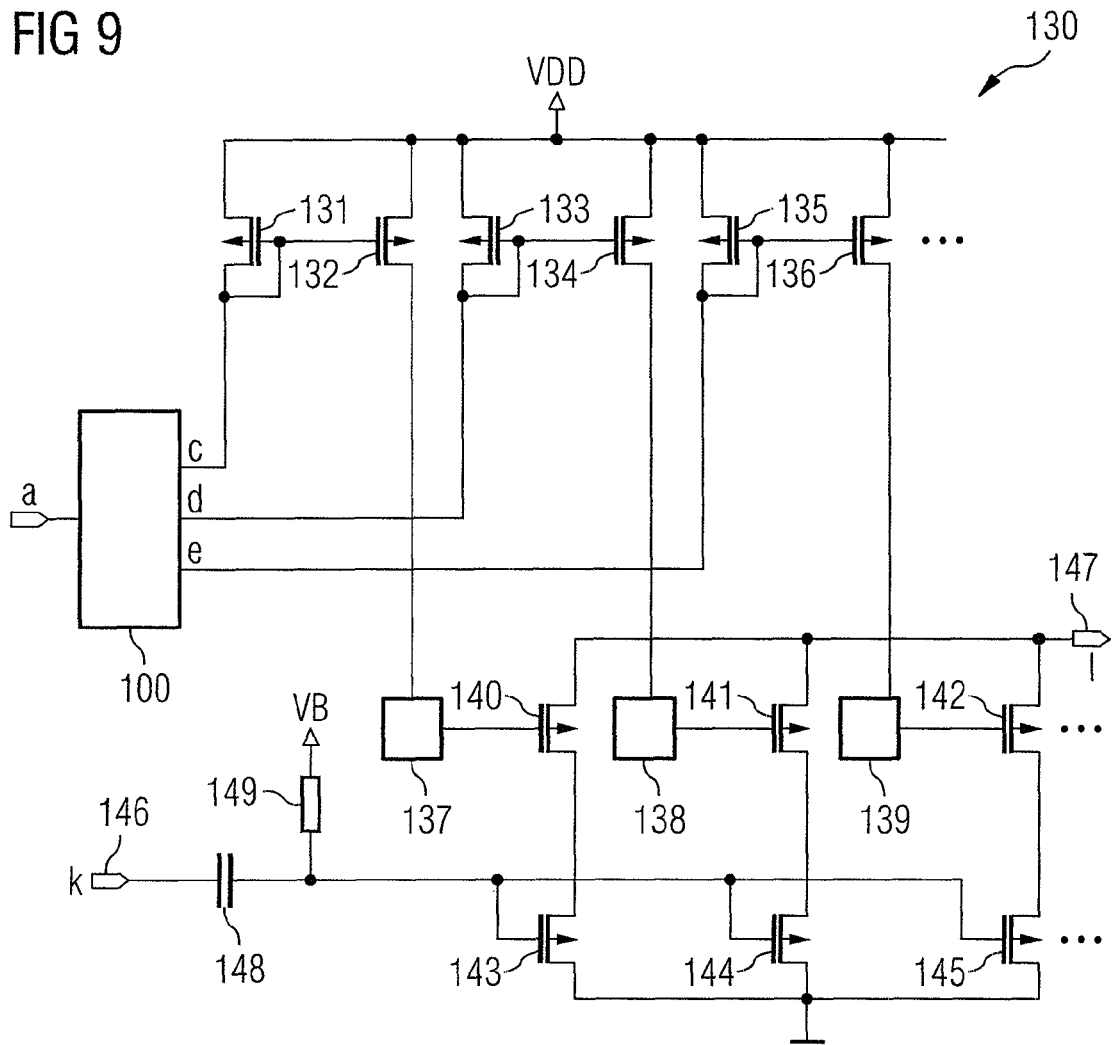
FIG. 9 shows a circuit diagram of an amplifier arrangement in accordance with a further embodiment of the present invention.

A circuit diagram of an amplifier arrangement in accordance with a further embodiment of the present invention is illustrated schematically in FIG. 9. In the amplifier arrangement illustrated in FIG. 9, an input signal k, which can be applied to an input 146, is amplified and output as an output signal l that can be tapped off from an output 147. The input signal k and the output signal l can be radiofrequency (RF) signals in each case. The input signal k is filtered by means of a capacitor 148, which filters out a DC component of the signal, and has a voltage applied to it by means of a resistor 149 connected to a bias voltage VB, and is then applied in parallel to gate terminals of three amplifier transistors 143, 144 and 145. In one embodiment, the bias voltage VB can be equal to the positive supply voltage VDD. In the embodiment illustrated, the three amplifier transistors 143, 144 and 145 are NMOS transistors and can have different dimensions. By way of example, the amplifier transistor 144 can have double the gate width compared with the amplifier transistor 143, and the amplifier transistor 145 can have double the gate width compared with the amplifier transistor 144. However, other size relationships are also possible. Through the parallel use of a plurality of amplifier transistors having different dimensionings, three amplifier transistors in the embodiment of FIG. 3, it is possible to define a gain range of the amplifier arrangement.

Each of the amplifier transistors 143, 144, 145 is connected up to a further transistor 140, 141 and 142, respectively, to form a cascode circuit. The further transistors 140, 141 and 142 serve for setting a desired gain factor and are driven, as explained below, inter alia, by means of a device 100 as explained with reference to FIG. 5. An input signal a of the device 100 serves as a control signal for setting the gain of the amplifier arrangement illustrated in FIG. 9. Output signals c, d and e of the device 100 are fed to a replica bias arrangement 130, which has, for each of the signals c, d, e, two NMOS transistors 131, 132 and 133, 134 and 135, 136, respectively, which are connected up in the manner illustrated in FIG. 9. The output currents of the replica bias arrangement 130 are applied to current/voltage converters 137, 138 and 139, respectively, which output output voltages for driving the gate terminals of the transistors 140, 141 and 142, respectively. By means of the control voltages applied to the gate terminals of the transistors 140, 141 and 142 in accordance with the ramped characteristic curves of the device 100, the transistors 140, 141 and 142 are opened or closed to a greater or lesser extent and the gain of the overall device is thus set.

By means of the replica bias arrangement 130 together with the device 100 in the embodiment of FIG. 9, it is possible in particular to compensate for a nonlinearity of the circuit section comprising the NMOS transistors 140-142, such that the replica bias arrangement 130 in the embodiment in FIG. 9 represents as it were an anti-nonlinearity. In other words, the replica bias arrangement 130 performs a predistortion that compensates for the distortion of the downstream circuit part. For this purpose, in one embodiment, the transistors 132, 134 and 136 can be configured essentially structurally identically to the transistors 140, 141 and 142, such that as a result of the compensation of the nonlinearities, a behavior of the amplifier circuit has a behavior that corresponds as a result of the output signals c, d and e.

In the embodiment in FIG. 9, therefore, nonlinearities of the amplifier arrangement can be eliminated by the use of the replica bias arrangement 130 together with the current/voltage converters 137, 138, 139, thus resulting in a continuous proportionality of the output current to the ramped characteristic curves of the device 100 in one embodiment. Through a suitable choice of the characteristic curves, it is possible in this case to achieve a desired dependence of the gain on the input signal a, for example a dB-linear dependence, even if the properties of the transistors 140 to 145 are nonlinear.

In one embodiment, the amplifier arrangement of the embodiment of FIG. 9 is fabricated using CMOS technology. In other embodiments, other technologies can also be used. As in the amplifier device from FIG. 8, the number of three parallel amplifier stages each comprising two NMOS transistors should be understood as by way of example, and any desired number of such stages can be provided depending on the desired gain and desired gain range. In one embodiment, the number of output signals of the device 100 and of the drive circuit parts, each comprising replica bias and current/voltage converter, for the transistors 140, 141, 142, . . . can then be chosen depending on the number of amplifier stages.

By way of example, a device 100 for generating output signals c, d, e as a function of an input signal a is used in the amplifier arrangements in FIGS. 8 and 9. Other devices, for example corresponding to the device 200 from FIG. 6 or the device 300 from FIG. 7, can be used for this in other embodiments.

In the amplifier arrangements in FIGS. 8 and 9, the ramped characteristic curves of the devices 100 or else of a device 200 or 300, as already explained, can be chosen as desired in order to obtain a desired dependence of the gain on the input signal a. By way of example, the ramp forms explained with reference to FIGS. 3 and 4 can be used. Other ramp forms can be used in other embodiments. One example of other possible ramped characteristic curves will now be explained with reference to FIG. 10.

Figure 10:
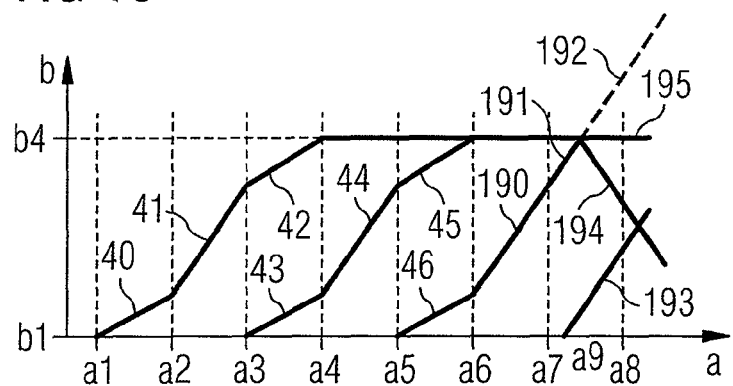
FIG. 10 shows a diagram with three offset ramped characteristic curves in accordance with another embodiment of the invention.

The embodiment in FIG. 10 involves generating once again three output signals in the manner corresponding to three offset ramped characteristic curves, where the number three should once again be understood only as an example. In the embodiment in FIG. 10, the first two ramped characteristic curves, that is to say the ramped characteristic curves which rise at relatively low values of the input signal a, are shaped in a manner corresponding to those explained with reference to FIG. 4, and the corresponding sections 40 to 45 bear the same reference symbols as in FIG. 4. By contrast, the "last" ramp, that is to say that ramped characteristic curve which, in comparison with the remaining ramped characteristic curves, begins to rise only at a relatively large value of the input signal a, at a value a5 in the example illustrated in FIG. 10, is modified compared with the embodiment of FIG. 4. This "last" ramped characteristic curve begins with a section 46 having a relatively small gradient between values a5 and a6 of the input signal a, corresponding to the section 46 from FIG. 4, and then rises linearly up to the end value b4 of the output signal b in sections 190, 191. After obtaining the value b4, the characteristic curve maintains this value b4, as indicated by reference symbol 195. In one embodiment, in this respect, a section having an average gradient as identified by reference symbol 190 is generated by one circuit section, and the curved profile 191, 195 is generated by two circuit sections, wherein the output signal of one circuit section is subtracted from the output signal of the other circuit section. By way of example, one circuit section can generate a first partial output signal as identified by reference symbols 191 and 192, and another circuit section can generate a second partial output signal as identified by reference symbol 193. The second partial output signal, which begins to rise at a value a9 corresponding to the saturation value b4 being attained, is inverted as indicated by curve 194 and added in inverted form to the first partial output signal corresponding to the curve section 192, that is to say that the second partial output signal is subtracted from the first partial output signal in order thus to form the section 195.

Such ramped characteristic curves as explained with reference to FIG. 10 can be used for example in radio frequency (RF) transceivers, for example in an amplifier arrangement corresponding to FIG. 8 or FIG. 9. Generally, amplifier arrangements as explained with reference to FIGS. 8 and 9, for example, can be used in communications equipment, e.g. transceivers or transmitters for wireless or wired transmission.

The application of devices as explained with reference to FIG. 2 and FIG. 5 is not restricted to the gain control in amplifier arrangements. An explanation is given below of multiplication devices in accordance with embodiments of the invention which are based on the device 35 of the embodiment in FIG. 2.

Figure 11:
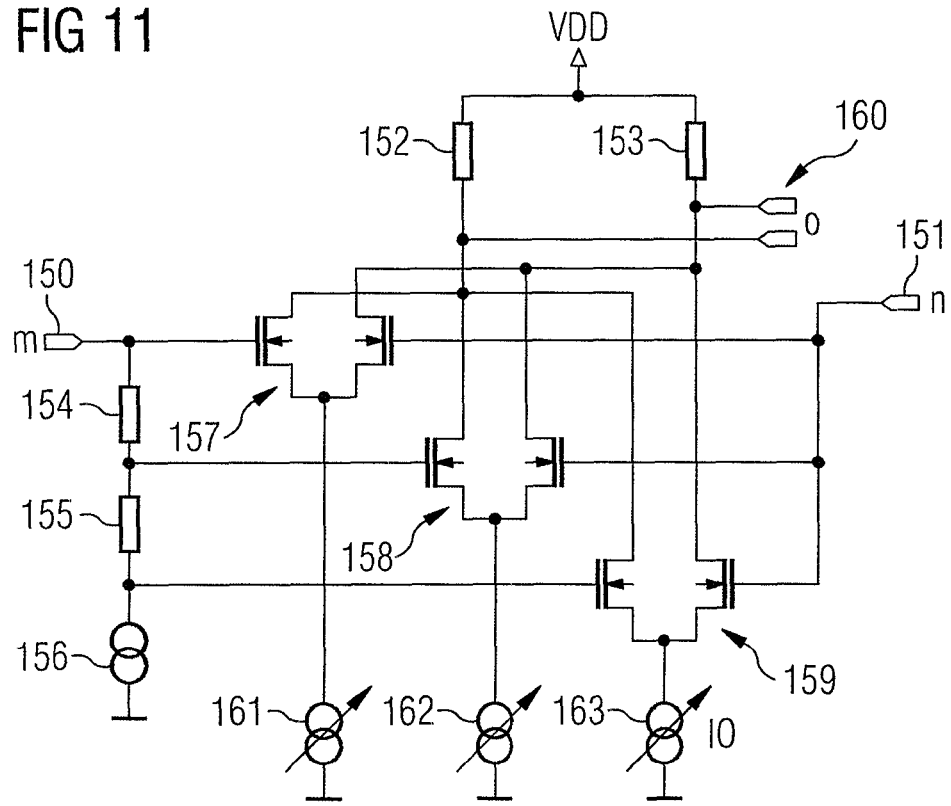
FIG. 11 shows a multiplication device in accordance with one embodiment of the present invention.

A first embodiment of a multiplication device according to the invention is illustrated in FIG. 11. The multiplication device of the embodiment in FIG. 11 comprises a first circuit section having a first differential amplifier 157 and a first current source 161, a second circuit section having a second differential amplifier 158 and a second current source 162, and a third circuit section having a third differential amplifier 159 and a third current source 163. Like the first to third circuit sections in FIG. 2, the first to third circuit sections are connected up to a positive supply voltage VDD via resistors 152 and 153, wherein an output signal o is tapped off at the resistors 152 and 153 at an output 160.

In the circuit, a first input 150 is connected up to a first input of the differential amplifier 157, via a resistor 154 to a first input of the differential amplifier 158, and via the resistor 154 and a resistor 155 to a first input of the differential amplifier 159, wherein the resistors 154 and 155 together with a current source 156 serve for generating an offset, in the manner corresponding to the function of the voltage sources 16 and 17 of the device 35 from FIG. 2. In the embodiment in FIG. 11, the respective first inputs correspond to the gate terminals of NMOS transistors depicted respectively on the left in FIG. 11. Accordingly, the differential amplifiers 157, 158, 159 have applied to them a signal m present at the first input 150 plus a respective offset. A second input 151 of the device in FIG. 11 is connected up to the respective second inputs of the differential amplifiers 157, 158, 159, to the gate terminals of the NMOS transistors depicted respectively on the right in the illustration in FIG. 11.

In the embodiment in FIG. 11, the current sources 161, 162 and 163 can be set to a current I0. A value of the output signal o is then determined as $$o = \alpha \cdot (m-n) \cdot I0,$$

where α is a constant, such that the device from FIG. 1; serves as a multiplier, wherein a first factor is determined by the input signals m, n and a second factor is determined by the current I0.

The number of three circuit sections in the device in FIG. 11 should once again be understood here as by way of example, and the number of circuit sections can be chosen for example depending on a desired range of the input signals m, n.

Figure 12:
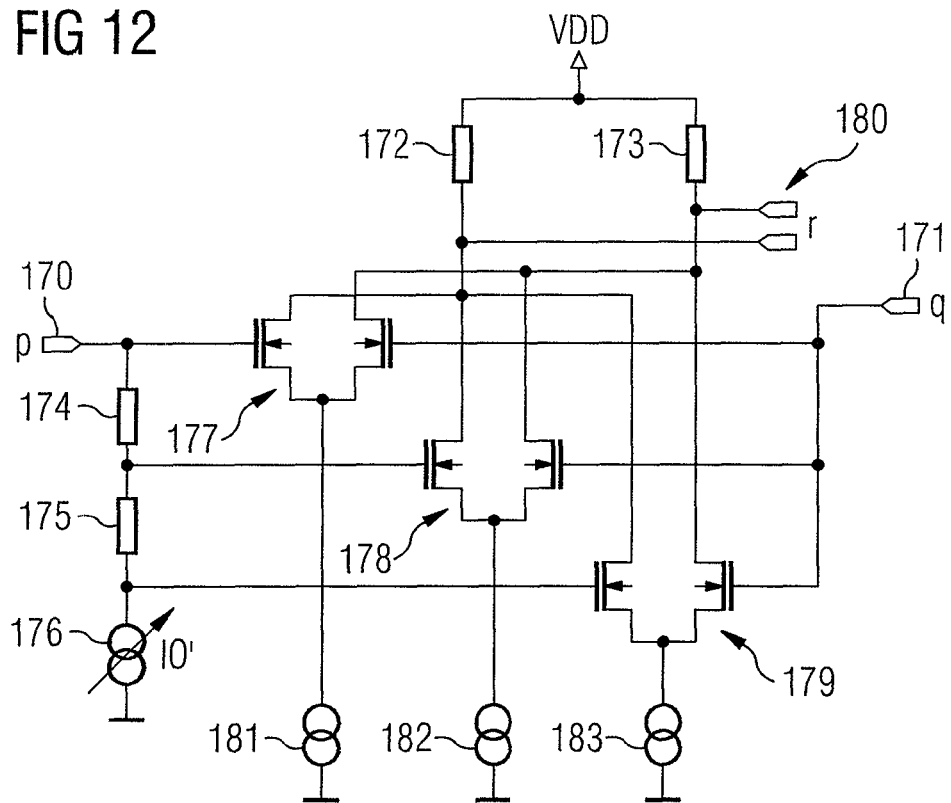
FIG. 12 shows a multiplication device in accordance with a further embodiment of the present invention.

A further embodiment of a multiplication device is illustrated in FIG. 12. The basic construction of the embodiment in FIG. 12 corresponds to that in FIG. 11, and mutually corresponding elements bear reference symbols increased by 20. By way of example, in FIG. 12 a first differential amplifier, a second differential amplifier and a third differential amplifier bear the reference symbols 177, 178 and 179, whereas they bear the reference symbols 157, 158 and 159 in the embodiment in FIG. 11. On account of the similarity of the embodiments in FIG. 12 and FIG. 11, the embodiment of FIG. 12 will not be described completely again, rather only the differences with respect to the embodiment of FIG. 11 are explained. In the embodiment in FIG. 12, the current sources 181, 182 and 183 each generate the same fixed output current. In the embodiment in FIG. 12, the current source 176 is an adjustable current source and generates a current I0'. In the embodiment in FIG. 12, therefore, the current source 176 serves as a further input for defining a multiplication factor.

An output signal r is calculated from the input signals p and q at the inputs 170, 171 in accordance with $$r = \beta \cdot (p-q) \cdot I0',$$

where β is a constant.

As in the embodiment in FIG. 11, more or fewer than three circuit sections can be present in the embodiment in FIG. 12, too. Moreover, the modifications already discussed for the device 35 from FIG. 2 can be implemented in the embodiments in FIG. 11 and FIG. 12. In particular, the resistors 152, 153 and 172, 173, respectively, can be omitted, and the output signals can be tapped off as current signals.

As mentioned devices as described above may be used for multiplying an input signal by a current.

The embodiments presented above should not be regarded as restrictive, but rather merely as by way of example. Moreover, the embodiments presented should not be interpreted to the effect that all the elements illustrated are essential. Rather, other embodiments may contain fewer elements than those illustrated.

What is claimed is:

1. A device for generating an output signal as a function of an input signal, comprising:
   an input,
   at least two circuit sections, wherein each circuit section of the at least two circuit sections is configured for generating a partial output signal,
   wherein the at least two circuit sections are coupled to the input in such a way that each of the at least two circuit sections has applied to it an input signal applied to the input plus an offset assigned to each circuit section, wherein at least two of the at least two circuit sections are assigned a different offset, and
   a further circuit section for combining the partial output signals of the at least two circuit sections to form an output signal,
   wherein each of the circuit sections determines a part of a ramped characteristic curve of the device.

2. The device as claimed in claim 1, wherein one of the at least two circuit sections is assigned an offset of zero.

3. The device as claimed in claim 1, wherein each of the at least two circuit sections comprises an amplifier.

4. The device as claimed in claim 3, wherein the amplifier comprises a differential amplifier, and wherein each differential amplifier is assigned a current source.

5. The device as claimed in claim 4, wherein the current sources are adjustable.

6. The device as claimed in claim 4, wherein each differential amplifier comprises a first transistor and a second transistor, wherein a control input of the first transistors is coupled to the input in such a way that they have applied to them the input signal applied to the input plus the respective offset, and wherein control inputs of the respective second transistors are coupled to a voltage source.

7. The device as claimed in claim 4, wherein each differential amplifier comprises a first transistor and a second transistor, wherein a control input of the first transistors is coupled to the input in such a way that they have applied to them the input signal applied to the input plus the respective offset, and wherein control inputs of the respective second transistors are coupled to a further input.

8. The device as claimed in claim 1, wherein the respective offsets are independent from said input signal.

9. The device as claimed in claim 1, wherein the device is manufactured using CMOS technology.

10. The device as claimed in claim 1, comprising a circuit section for generating a further partial output signal, wherein the device is configured in such a way that the further partial output signal is subtracted from at least one of the partial output signals.

11. A signal generating device for generating a plurality of output signals, comprising:
    a plurality of devices for generating a respective output signal as a function of a respective input signal, each device comprising:
       an input,
       at least two circuit sections, wherein each circuit section of the at least two circuit sections is configured for generating a partial output signal,
       wherein the at least two circuit sections are coupled to the input in such a way that each of the at least two circuit sections has applied to it an input signal applied to the input plus an offset assigned to each circuit section, wherein at least two of the at least two circuit sections are assigned a different offset, and
       a further circuit section for combining the partial output signals of the at least two circuit sections to form said respective output signal,
    wherein the devices have at least one common input, and
    wherein each of the devices has a ramped characteristic curve.

12. The signal generating device as claimed in claim 11, wherein the offsets assigned to the circuit sections of the devices differ at least partly from device to device.

13. The signal generating device as claimed in claim 11, wherein each of the devices has a circuit section which is assigned an offset which corresponds to an offset assigned to a circuit section of another device.

14. An amplifier arrangement, comprising:
    an amplifier input,
    an amplifier output,
    a plurality of parallel amplifier stages, wherein each of the amplifier stages is coupled to the amplifier input and an output of each of the amplifier stages is coupled to the amplifier output, and
    a signal generating device, wherein the signal generating device is configured for generating a number of output signals corresponding to a number of amplifier stages and wherein a respective output of the signal generating device is coupled to a respectively assigned amplifier stage of the amplifier stages in such a way that a gain of the respective amplifier stage is adjustable by means of the respective output signal of the signal generating device, the signal generating device comprising:
       a plurality of devices for generating a respective output signal as a function of a respective input signal, each device comprising:
          an input,
          at least two circuit sections, wherein each circuit section of the at least two circuit sections is configured for generating a partial output signal,
          wherein the at least two circuit sections are coupled to the input in such a way that each of the at least two circuit sections has applied to it an input signal applied to the input plus an offset assigned to each circuit section,
          wherein at least two of the at least two circuit sections are assigned a different offset, and
          a further circuit section for combining the partial output signals of the at least two circuit sections to form said respective output signal,
       wherein the devices have at least one common input.

15. The amplifier arrangement as claimed in claim 14, wherein each of the amplifier stages comprises a differential amplifier, wherein the output of the device assigned to the respective amplifier stage is coupled to a current input of the differential amplifier of the amplifier stage.

16. The amplifier arrangement as claimed in claim 15, wherein each of the differential amplifiers comprises a first transistor and a second transistor, wherein, in each differential amplifier, a dimensioning of the first transistor is identical to a dimensioning of the second transistor, and wherein the transistors of a first differential amplifier of the differential amplifiers are dimensioned differently than the transistors of a second differential amplifier of the differential amplifiers.

17. The amplifier device as claimed in claim 16, wherein the different dimensioning comprises different gate widths.

18. The amplifier device as claimed in claim 14, wherein each amplifier stage comprises a cascode circuit having a first transistor and a second transistor wherein a control input of each first transistor is coupled to the amplifier input, and wherein a control input of each second transistor is coupled to the respectively assigned output of the signal generating device.

19. The amplifier device as claimed in claim 18, wherein each of the second transistors is coupled to the respective device via at least one element selected from the group comprising a replica bias arrangement and a current/voltage converter.

20. A method for amplifying a signal, comprising:
generating a plurality of control signals in accordance with a plurality of offset ramped characteristic curves as a function of a control input signal,
leading each control signal of the plurality of control signals to a respectively assigned amplifier stage for setting a gain of the respective amplifier stage, and
amplifying an input signal by means of the plurality of amplifier stages.

21. The method as claimed in claim 20, wherein the step of generating a plurality of control signals comprises:
generating a plurality of partial control signals for each control signal, wherein each partial control signal determines a part of the respective ramped characteristic curve, and composing the plurality of control signals from the partial control signals.

22. The method as claimed in claim 21, comprising:
generating a further partial control signal, and
subtracting the further partial control signal from at least one of the partial control signals.

* * * * *